United States Patent
Boeve

(10) Patent No.: US 7,359,233 B2
(45) Date of Patent: Apr. 15, 2008

(54) NON-HOMOGENEOUS SHIELDING OF AN MRAM CHIP WITH MAGNETIC FIELD SENSOR

(75) Inventor: Hans Marc Bert Boeve, Eindhoven (NL)

(73) Assignee: NXP, B.V., Eindhoven (NL)

( * ) Notice: Subject to any disclaimer, the term of this patent is extended or adjusted under 35 U.S.C. 154(b) by 55 days.

(21) Appl. No.: 10/579,929

(22) PCT Filed: Nov. 9, 2004

(86) PCT No.: PCT/IB2004/052358

§ 371 (c)(1),
(2), (4) Date: May 19, 2006

(87) PCT Pub. No.: WO2005/050659

PCT Pub. Date: Jun. 2, 2005

(65) Prior Publication Data

US 2007/0103967 A1 May 10, 2007

(30) Foreign Application Priority Data

Nov. 24, 2003 (EP) .................................. 03104343

(51) Int. Cl.
*G11C 11/00* (2006.01)

(52) U.S. Cl. ........................ 365/158; 365/171; 365/173
(58) Field of Classification Search ................ 365/158, 365/171, 173
See application file for complete search history.

(56) References Cited

U.S. PATENT DOCUMENTS

| 6,747,301 | B1* | 6/2004 | Hiner et al. ................. 257/295 |
| 6,999,339 | B2* | 2/2006 | Tuttle et al. ................. 365/158 |
| 7,230,844 | B2* | 6/2007 | Deak .......................... 365/171 |

* cited by examiner

*Primary Examiner*—Son Dinh
*Assistant Examiner*—Hien Nguyen
(74) *Attorney, Agent, or Firm*—Peter Zawilski

(57) ABSTRACT

The present invention provides a magnetoresistive memory device (30) comprising an array (20) of magnetoresistive memory elements (10) and at least one magnetic field sensor element (32), wherein the magnetoresistive memory device (30) comprises a partial or non-homogeneous shielding means (40, 41) so as to shield the array (20) of magnetoresistive memory elements (10) differently from an external magnetic field than the at least one magnetic field sensor element (32). With "differently" is meant that there is a minimum shielding difference of 5%, preferably a minimum shielding difference of 10%. The present invention also provides a corresponding shielding method.

8 Claims, 2 Drawing Sheets

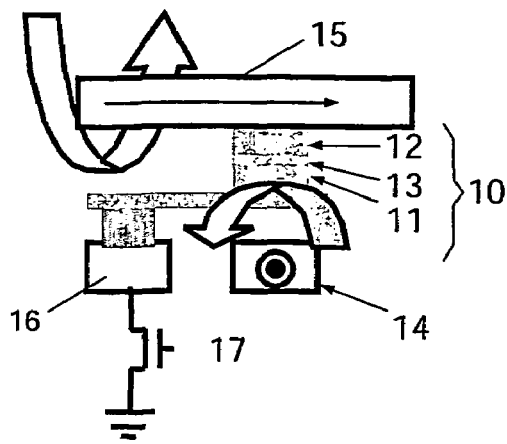
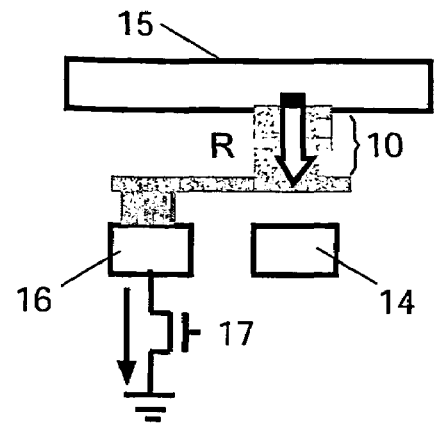
FIG.1A FIG.1B
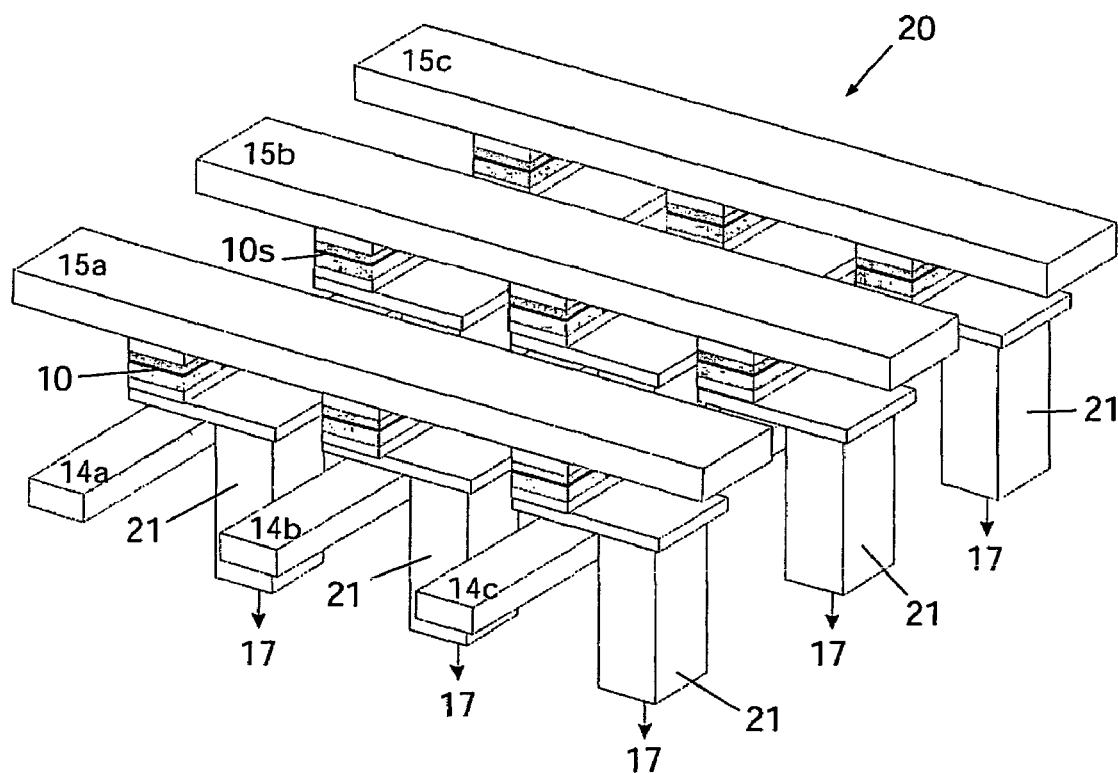
FIG.2

NON-HOMOGENEOUS SHIELDING OF AN MRAM CHIP WITH MAGNETIC FIELD SENSOR

The present invention relates to a method and device for qualitative detection or quantitative measurement of an external magnetic field present at a magnetoresistive memory array, such as an MRAM array. This detection or measurement may be used to take countermeasures during programming of magnetoresistive memory elements when the external magnetic field exceeds a certain threshold value.

Magnetic or Magnetoresistive Random Access Memory (MRAM is currently being considered by many companies as a successor to flash memory. It has the potential to replace all but the fastest static RAM (SRAM) memories. This makes MRAM very suitable as embedded memory for System on Chip (SoC). It is a non-volatile memory (NVM) device, which means that no power is required to sustain the stored information. This is seen as an advantage over most other types of memory. MRAM memories can be used in particular for 'mobile' applications, such as smartcards, mobile phones, PDA's, etc.

The MRAM concept was originally developed at Honeywell Corp. USA, and uses magnetization direction in a magnetic multi-layer device as information storage and the resultant resistance difference for information readout. As with all memory devices, each memory element in an MRAM array must be able to store at least two binary states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR effect provide possibilities to realize a.o. non-volatile magnetic memories. These devices comprise a stack of thin films of which at least two are ferromagnetic or ferrimagnetic, and which are separated by a non-magnetic interlayer. GMR is the magneto-resistance for structures with conductor inter-layers and TMR is the magneto-resistance for structures with dielectric inter-layers. If a very thin conductor is placed between two ferromagnetic or ferrimagnetic films, then the effective in-plane resistance of the composite multi-layer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 10-14% magneto-resistance in good GMR memory elements.

A typical MRAM device comprises a plurality of magnetoresistive memory elements 10 of which one is illustrated in FIGS. 1A and 1B, e.g. magnetic tunneling junction (MTJ) elements, arranged in an array. An array 20 of magnetoresistive memory elements 10 is illustrated in FIG. 2. MTJ memory elements 10 generally include a layered structure comprising a fixed or pinned hard magnetic layer 11, a free layer 12 and a dielectric barrier 13 in between. The pinned layer 11 of magnetic material has a magnetic vector that always points in the same direction. The free layer 12 is used for information storage. The magnetic vector of the free layer 12 is free, but constrained within the easy axis of the free layer 12, which is determined chiefly by the physical dimensions of the memory element 10. The magnetic vector of the free layer 12 points in either of two directions: parallel or anti-parallel with the magnetization direction of the pinned layer 11, which coincides with the said easy axis. The fundamental principle of MRAM is the storage of information as binary data, e.g. as "0" and "1", based on directions of magnetization. This is why the magnetic data is non-volatile and will not change until it is affected by a magnetic field.

Storing or writing data into a magnetoresistive memory element 10 is accomplished by applying magnetic fields and thereby causing magnetic material in the free layer 12 to be magnetized into either of two possible memory states. When both magnetic films 11, 12 of the layered structure of an MRAM-element 10 are magnetized with the same orientation (parallel), the data is either of two binary values, e.g. "0", otherwise, if both magnetic films 11, 12 of the layered structure of the MRAM-element 10 are magnetized with inverse orientation (anti-parallel), the data is the other binary value, e.g. "1". The magnetic fields are created by passing currents through current lines (word lines 14, 14a, 14b, 14c and bit lines 15, 15a, 15b, 15c) external to the magnetic structures. It is to be noted that two magnetic field components are used to differentiate between a selected memory element 10s and other non-selected memory elements 10.

Reading data is accomplished by sensing resistance changes in a magnetic memory element 10 when magnetic fields are applied. Making use of the fact that the resistance of the layered structure 11, 12, 13 varies depending on whether or not the orientations are parallel, the system can discriminate both binary values of the data, e.g. "0" or "1". The magnetic fields required for readout are created by passing currents through current lines (word lines) external to the magnetic structures, or through the magnetic structures themselves (via bit line 15 and sense lines 16). Reading of a selected memory element 10s is done through a series transistor 17 connected to a via 21 to avoid sneak currents through other memory elements 10.

The most common MRAM design is the type 1T1MTJ (1 transistor 17 per 1 MTJ memory element 10), as illustrated in FIGS. 1A and 1B. A memory array 20 comprising a plurality of memory elements 10 comprises orthogonal bit lines 15a, 15b, 15c and word lines 14a, 14b, 14c patterned separately into two metal layers respectively under and above the magnetic tunnel junction (MTJ) memory elements 10. The bit lines 15a, 15b, 15c are parallel with the hard axis of the memory elements 10, which creates a magnetic field in the easy axis, while the word lines 14a, 14b, 14c otherwise create a magnetic field in the hard axis. In some designs the relations can be reversed, i.e. the bit lines 15 may create a hard axis field and the word lines 14 may create an easy axis field. Writing on a selected memory element 10s is done by simultaneously applying current pulses through the respective bit line 15b and word line 14a that intersect at the selected memory element 10s. The direction of the resultant field makes an angle of 45° with respect to the easy axis of the free layer 12 of the memory element 10s. At this angle, the switching field of the free layer 12 is the smallest, thus writing can be done with the least current.

It is a disadvantage of MRAM elements that an intentional or unintentional exposure to strong external magnetic fields makes them vulnerable. Very high density MRAM arrays 20 are particularly sensitive to magnetic fields mainly because the minuscule MRAM elements 10 require relatively low magnetic fields for read/program operations which depend upon the switching or sensing of magnetic vectors in the free layers 12. These magnetic vectors are, in turn, easily affected and may have their magnetic orientation changed by such external magnetic fields.

If an extra external magnetic field were present during a programming operation, this may cause undesired switching of non-selected magnetoresistive memory elements 10 because the combined magnetic field of the current flowing through one current line, with the external magnetic field, may by itself be large enough to switch the state of the non-selected memory element 10. Moreover, a programming operation may also result in not switching of the selected memory element 10s, if the external magnetic field would point in a different direction, and thus counteract the magnetic field created by the current flowing through a current line. This means that magnetic fields which are generated by flowing a current through a current line, may, due to the presence of an external magnetic field, be large enough to undesirably switch a non selected memory element 10, which would not be possible without the external magnetic field being present. Alternatively, if the external magnetic field has a different direction, magnetic fields may be too small to result in switching of the selected memory element 10s, which would not be possible without the external magnetic field being present.

A solution would be to shield the memory elements from any external field. A magnetic shield reduces the local magnetic field by a field reduction ratio, e.g. 1:5 or 1:10. The effective magnetic field under the shield is therefore strongly reduced, in the second example given with a factor 1:10, i.e. the external magnetic field under the shield over the MRAM array is a factor 10 lower than the external magnetic field actually present. However, also shielding has its limits so that, always, a higher magnetic field can be applied which will cause an external magnetic field in the vicinity of the data layer of the magnetoresistive memory elements 10 which has a disturbing effect.

Solutions have been proposed in other patent applications filed by the applicant, and incorporated herewith by reference, e.g. "Data retention indicator for MRAM", "Write-disable option for MRAM operation", and "Active field compensation during MRAM-write". These solutions all comprise incorporating a magnetic field sensor with or in the vicinity of the array of magnetoresistive elements 10, in order to measure the external magnetic field value, and depending on the result, take some action such as disable programming of magnetoresistive elements, or adapting the currents flowing through current lines for programming.

For shielded MRAM chips, this reduces the problem to the implementation of a sensitive magnetic field sensor, as small fields, i.e. fields below 10 Oe, have to be measured. However, it proves difficult to implement sensors which give a good and reliable output signal when measuring a small magnetic field.

It is an object of the present invention to provide a method and device for detecting or measuring an external magnetic field in the vicinity of an array of magnetoresistive memory elements, without having to use very sensitive magnetic field sensors.

The above objective is accomplished by a method and device according to the present invention.

In a first aspect, the present invention provides a magnetoresistive memory device comprising an array of magnetoresistive memory elements and at least one magnetic field sensor element. The magnetoresistive memory device comprises a partial or non-homogeneous shielding means so as to shield the array of magnetoresistive memory elements differently from an external magnetic field than the at least one magnetic field sensor element. The difference in shielding of the array and of the magnetic field sensor element exceeds process variations i.e. there is a shielding difference of at least 5%, preferably a shielding difference of at least 10%, whereby the array may be shielded more or less than the at least one magnetic field sensor element.

The at least one magnetic field sensor element may be shielded with first shielding means having a first magnetic field reduction ratio, and the array of magnetoresistive memory elements may be provided with second shielding means having a second magnetic field reduction ratio, the second magnetic field reduction ratio being smaller than the first magnetic field reduction ratio. The second magnetic field reduction ratio may be smaller than the first magnetic field reduction ratio. Alternatively, the first magnetic field reduction ratio may be 1:1, which means that there is no shielding of the at least one magnetic field sensor element.

The array of magnetoresistive memory elements and the at least one magnetic field sensor element may be integrated monolithically on a single chip. The array of magnetoresistive memory elements and the at least one magnetic field sensor element may also be located on separate dies in a single package. Or the array of magnetoresistive memory elements and the at least one magnetic field sensor element may be located on separate dies in separate packages.

In a second aspect, the present invention provides a method for measuring an external magnetic field present at an array of magnetoresistive memory elements. The method comprises shielding a magnetic field sensor element with a first shielding means having a first magnetic field reduction ratio, and shielding the array of magnetoresistive memory elements with a second shielding means having a second magnetic field reduction ratio, wherein the first and second magnetic field reduction ratios are different from each other, i.e. have a shielding difference of at least 5%, and determining the external magnetic field value at the array of magnetoresistive memory elements based on the knowledge of the first and second magnetic field reduction ratio.

The second magnetic field reduction ratio may be smaller than the first magnetic field reduction ratio. A relationship between the (local) reduced magnetic fields and the external magnetic field may be linear, or in other words, the first and second magnetic field reduction ratio may be constant for a particular external magnetic field range. The first magnetic field reduction ratio may be 1:1.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

FIG. 1A illustrates the MRAM programming principle and FIG. 1B illustrates the MRAM read principle.

FIG. 2 is a perspective view of a known 1T1MTJ MRAM design comprising a plurality of memory elements and perpendicular bit lines and word lines. Magnetic tunnel junctions (MTJ) are placed at the intersection regions of the bit lines and word lines. The bottom electrodes of the MTJs are connected to selection transistors with vias, which are used when reading the memory elements.

Figure 3:
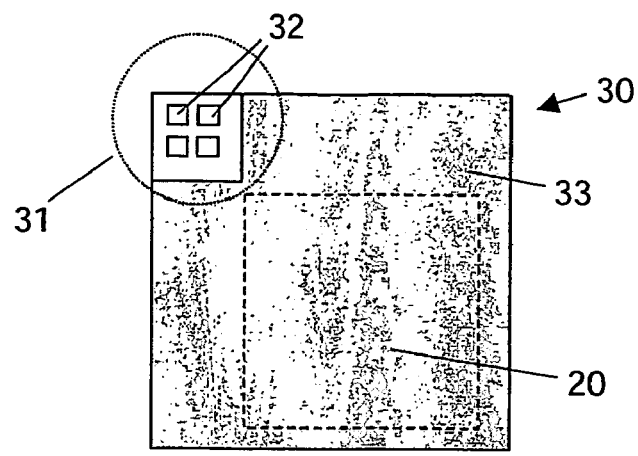
FIG. 3 illustrates partial MRAM shielding with monolithically integrated magnetic field sensor(s) in a non-shielded area, according to a first embodiment of the present invention.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The present invention provides a method for detecting or measuring an external magnetic field in the vicinity of an array of magnetoresistive memory elements, which detection or measurement may be used to reduce the possibility of, or to prevent erroneous programming of a magnetoresistive memory element during presence of the external magnetic field. A corresponding magnetoresistive memory device is also provided.

A magnetoresistive memory device 30 according to embodiments of the present invention comprises an array 20 of magnetoresistive memory elements 10 and a magnetic field sensor unit 31, as illustrated in FIG. 3.

The array 20 of magnetoresistive memory elements 10 is logically organized in rows and columns. Throughout this description, the terms "horizontal" and "vertical" are used to provide a co-ordinate system and for use of explanation only. They do not need to, but may, refer to an actual physical direction of the device. Furthermore, the terms "row" and "column" are used to describe sets of array elements which are linked together. The linking can be in the form of a Cartesian array of rows and columns; however, the present invention is not limited thereto. As will be understood by those skilled in the art, columns and rows can be easily interchanged and it is intended in this disclosure that these terms will be interchangeable. Also, non-Cartesian arrays may be constructed and are included within the scope of the invention. Accordingly the terms "row" and "column" should be interpreted widely. To facilitate in this wide interpretation, the terminology "logically organized in rows and columns" is used. By this is meant that sets of memory elements are linked together in a topologically linear intersecting manner; however, that the physical or topographical arrangement need not be so. For example, the rows may be circles and the columns may be radii of these circles and the circles and radii are described in this invention as "logically organized" in rows and columns. Also, specific names of the various lines, e.g. bit line and word line, or row line and column line, are intended to be generic names used to facilitate the explanation and to refer to a particular function and this specific choice of words is not intended in any way to limit the invention. It should be understood that all these terms are used only to facilitate a better understanding of the specific structure being described, and are in no way intended to limit the invention.

The magnetic field sensor unit 31 is provided to detect or measure an external magnetic field in the neighborhood of the memory array 20. The detected or measured external magnetic field is preferably an external-magnetic field adjacent or near the memory array 20, i.e. a magnetic field which could influence the operation of the array. The magnetic field sensor unit 31 may comprise at least one analog or digital magnetic field sensor element 32. The magnetic field in the vicinity of the memory array 20 can be measured in various ways, either directly or indirectly.

The magnetic field sensor unit 31 can comprise any type of magnetic field sensor element 32 which may be added to the circuit comprising magnetoresistive memory elements 10, e.g. to an MRAM IC. Preferably, the magnetic field sensor unit 31 is integrated into magnetoresistive memory array 20. The magnetic field sensor unit 31 can comprise, for example, as a sensor element 32 a Hall sensor, which is a solid state semiconductor sensor which senses magnetic field strength and produces as output a voltage that changes with this strength.

However, in case of the magnetoresistive memory array 20 comprising MRAM elements 10, it is advantageous to use as magnetic field sensor element 32 a magnetic tunnel junction with the same stack composition as the MRAM elements 10 in the array 20. Further, the MRAM elements 10 themselves, or additional MRAM elements which are not used as memory elements could serve as magnetic field sensor elements 32 to monitor the local external disturbing field.

Because of the bi-stable magnetization configuration of MRAM elements as magnetic field sensor elements 32, they are not particularly sensitive to small fields. As soon as they are significantly influenced by a field to produce a sensible output signal, there is a risk that also MRAM elements 10 containing data are already affected by the disturbing field. Therefore, according to an aspect of the present invention, the magnetoresistive memory elements 10 and the magnetic field sensor unit 31 are shielded to a different degree, the magnetoresistive memory elements 10 being shielded more from the external magnetic field than the magnetic field sensor unit 31. The difference in shielding may be expressed as at least 5 to 10%. The minimum difference in shielding must overcome possible variations on the local shielding factor on the chip to become effective, e.g. as a consequence of process variations in terms of layer thickness, material composition, magnetic domain structure, etc. This leads to the external magnetic field value measured being larger than the external magnetic field value actually present at the array 20 of magnetoresistive memory elements 10. However, as the shielding reduces the local disturbing external magnetic field by a field reduction ratio, then based on the knowledge of the field reduction ratio of the magnetic shielding, the effective magnetic field under the shield above the MRAM array 20 can be determined from the magnetic field value measured by the magnetic field sensor unit 31.

Shielding the array 20 and the magnetic field sensor unit 31 to a different degree may be obtained according to a first embodiment of the present invention by implementing partial shielding to a magnetoresistive memory device 30, for example an MRAM chip, comprising an array 20 of magnetoresistive memory elements 10 and a magnetic field sensor unit 31. As an example, in FIG. 3 a partial magnetic shielding means 33 is provided, which is a magnetic shield so that part, e.g. one of the corners, of the magnetoresistive memory device 30 is not shielded. At this non-shielded location, a magnetic field sensor unit 31, for example comprising a plurality of magnetic field sensor elements 32 is implemented. This way, the magnetic field sensor elements 32 measure the actual value of the external magnetic field as present in the vicinity of the array 20 of magnetoresistive memory elements 10, while the external magnetic field felt by the array 20 is lower, depending on the field reduction ratio of the shield. For example, if the external magnetic field has a magnetic field value H, and the field reduction ratio of the shield is 1:x, thus the numerical value of the magnetic field reduction ratio is between 0 (infinite shielding) and 1 (no shielding), the external magnetic field sensed by the memory elements 10 equals H/x. From the magnetic field H measured, and the field reduction ratio 1:x which is known for a given magnetoresistive device according to the present invention, the external magnetic field at the array 20 can be determined.

In a second embodiment, not represented in the drawings, only the magnetoresistive memory array 20 is shielded, i.e. where the magnetoresistive memory elements 10 are located, and not the other circuitry such as drive circuitry (including the magnetic field sensor unit 31) for example.

Figure 4:
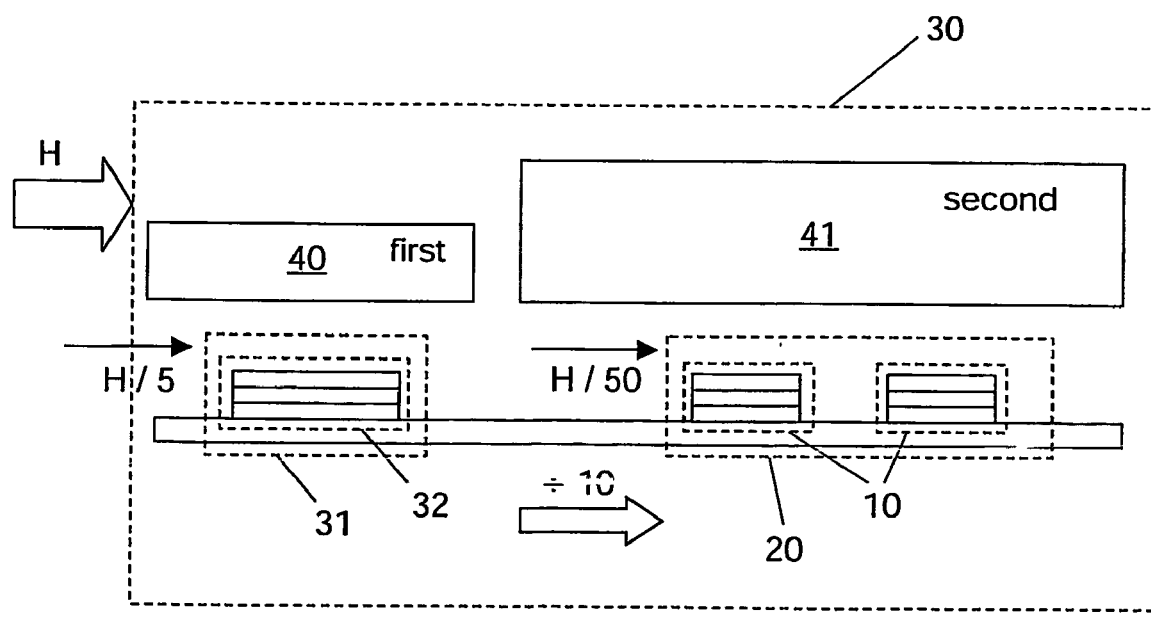
FIG. 4 illustrates an MRAM chip with non-homogeneous shielding, i.e. different field reduction ratio, for the field sensor area and the memory array area, according to a further embodiment of the present invention.

In a third embodiment, as illustrated in FIG. 4, a magnetoresistive memory device 30 according to the present invention can be non-homogeneously shielded. This means that the magnetic field sensor unit 31 comprising at least one magnetic field sensor element 32 is shielded by first shielding means 40 having a first field reduction ratio, e.g. 1:2, and the memory array 20 is shielded by second shielding means 41 having a second reduction ratio, e.g. 1:10. According to the present invention, the second field reduction ratio is smaller than the first field reduction ratio.

This embodiment has the advantage that there is more flexibility in the conversion of magnetic field values from the magnetic field sensor element 32 to the magnetic field values at the shielded magnetoresistive memory array 20. In the example given hereinabove, a conversion factor 1:5 can be obtained. This option can e.g. be implemented for tuning the sensor characteristics of the magnetic field sensor unit 31 for a particular field range, irrespective of the field reduction ratio of the memory array 20.

In a further embodiment, a data retention indicator (see patent application of the present applicant, filed on the same date as the present patent application and entitled "Data retention indicator for MRAM", which patent application is incorporated herewith by reference) using a basic cell that is identical to a memory cell 10 of the magnetoresistive memory array 20 can be implemented by using a different conversion factor, or, in other words, a non-homogeneous shielding of the basic cell and of the magnetoresistive memory array 20. Due to the fact that the data retention indicator can be exposed to a higher external magnetic field compared to the memory array 20, the data retention status of the data in the memory array 20 can be retrieved. As an example, a small difference in shielding factor, e.g. 10%, may allow to indicate the data retention of the memory array with sufficient statistical accuracy, e.g. at a 6-σ value of the switching field distribution with standard deviation σ of the memory elements 10 in the memory array 20.

Different methods of integrating the magnetic field sensor unit 31 with the magnetoresistive memory device 30 are included within the scope of the present invention, and some examples are described hereinafter:

(1) A first approach is to integrate the magnetic sensor unit 31 on the magnetoresistive chip—also called a monolithic integration. Hence, the sensor unit 31 will be very close to the memory array 20, and can possibly be included somehow in the memory array 20 itself. The sensor unit 31 can also be placed at a corner of the chip, as illustrated in FIG. 3. Shielding is different for the sensor unit 30 and for the memory array 20, and is thus non-homogeneous over the magnetoresistive memory device 30. Shielding for the sensor unit 31 is not necessarily present, thus leading to a partial shielding implementation.

(2) A second approach is a hybrid method. The magnetic field sensor unit 31 is no longer on a part of the substrate, for example silicon, on which the magnetoresistive memory array 20 is located, e.g. embedded MRAM (e-MRAM) within a larger system, or SoC (system-on-chip). Due to high cost of implementing different functionality, in particular in the sensor area, there is a trend to 'horizontal' integration, or system-in-package, where different dies are combined into a single package. The proposal here is to combine two chips in one single package, i.e. a first chip comprising the magnetoresistive array 20 and a second chip, on which the at least one magnetic field sensor element 32 is located. One of the reasons for doing so could be the fact that a magnetoresistive memory chip can require a high level of shielding, which is not required for the magnetic sensor unit 31. In other words, it may be cost-effective to combine functions that may require a different level of shielding in a hybrid way.

(3) A further approach would be to simply use two different chips that are also separately packaged. One of the reasons for doing so could be the fact that a magnetoresistive memory chip can require a higher level of shielding, that may be at least partly integrated into the package, rather than on the chip itself.

It is to be noted that the at least one magnetic field sensor element 32 preferably provides a 2D representation of the magnetic field in the vicinity of the magnetoresistive array 20. The distance between the at least one magnetic field sensor element 32 and the array 20 is preferably such that the field that is present in the magnetoresistive memory array 20 is measured. Since the far magnetic field will mostly be considered, length scales are moderate. Depending on the level of integration, as explained above, different distances may be used. In an on-chip implementation, the at least one magnetic field sensor element 32 is preferably as close as possible to the magnetoresistive memory array 20, or when unshielded up to a distance of 1 cm therefrom. For a hybrid implementation in a single package, the distance will be in the order of 1 cm, and for different packages, it is preferred to place the at least one sensor element 32 and the magnetoresistive memory array 20 close together, e.g. next to one another, or the at least one sensor element 32 on top of the magnetoresistive memory array 20.

In all of the above integration types, the magnetic field sensor 32 output may be used as a signal representative of the local, external magnetic field at the location of the magnetoresistive memory array 20. Based on the knowledge of the field reduction ratio of the magnetic shielding 40, 41, and their relation, there for example being a linear or fixed relationship between them, the effective magnetic field under the shield 41 above the magnetoresistive memory array 20 can be determined.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A magnetoresistive memory device comprising an array of magnetoresistive memory elements and at least one magnetic field sensor element, wherein the magnetoresistive memory device comprises a partial or non-homogeneous shielding means so as to shield the array of magnetoresistive memory elements differently from an external magnetic field than the at least one magnetic field sensor element, there being a shielding difference of at least 5%; and
    wherein the at least one magnetic field sensor element is shielded with first shielding means having a first magnetic field reduction ratio, and the array of magnetoresistive memory elements is provided with second shielding means having a second magnetic field reduction ratio, the second magnetic field reduction ratio being smaller than the first magnetic field reduction ratio.

2. A magnetoresistive memory device according to claim 1, wherein the first magnetic field reduction ratio is 1:1.

3. A magnetoresistive memory device according claim 1, wherein the array of magnetoresistive memory elements and the at least one magnetic field sensor element are integrated monolithically on a single chip.

4. A magnetoresistive memory device according claim 1, wherein the array of magnetoresistive memory elements and the at least one magnetic field sensor element are located on separate dies in a single package.

5. A magnetoresistive memory device according claim 1, wherein the array of magnetoresistive memory elements and the at least one magnetic field sensor element are located on separate dies in separate packages.

6. A method for measuring an external magnetic field present at an array of magnetoresistive memory elements, comprising shielding a magnetic field sensor element with a first shielding means having a first magnetic field reduction ratio, shielding the array of magnetoresistive memory elements with a second shielding means having a second magnetic field reduction ratio, there being a shielding difference of at least 5% between the first and the second magnetic field reduction ratio, and determining the external magnetic field value at the array of magnetoresistive memory elements based on the knowledge of the first and second magnetic field reduction ratio.

7. A method according to claim 6, wherein the second magnetic field reduction ratio is smaller than the first magnetic field reduction ratio.

8. A method according to claim 6, wherein a relationship between the first and second magnetic field reduction ratio is constant for an external magnetic field range.

* * * * *